United States Patent
Miura et al.

(10) Patent No.: US 7,983,889 B2
(45) Date of Patent: Jul. 19, 2011

(54) SIMULATION METHOD AND SIMULATION APPARATUS FOR LDMOSFET

(75) Inventors: Mitiko Miura, Higashihiroshima (JP);
Masahiro Yokomichi, Higashihiroshima (JP); Takahiro Kajiwara, Higashihiroshima (JP); Norio Sadachika, Higashihiroshima (JP); Masataka Miyake, Higashihiroshima (JP); Takahiro Iizuka, Machida (JP); Masahiko Taguchi, Nagaokakyo (JP); Tatsuya Ohguro, Yokohama (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 561 days.

(21) Appl. No.: 12/130,320

(22) Filed: May 30, 2008

(65) Prior Publication Data
US 2009/0070084 A1 Mar. 12, 2009

(30) Foreign Application Priority Data

Sep. 12, 2007 (JP) ................. 2007-237184

(51) Int. Cl.
*G06F 17/50* (2006.01)
(52) U.S. Cl. .............................. 703/14; 703/2
(58) Field of Classification Search ............... 703/2, 13, 703/14
See application file for complete search history.

(56) References Cited

OTHER PUBLICATIONS

M.B. Willemsen, et al., "High-Voltage LDMOS Compact Modeling", NSTI-Nanotech, vol. 3, 2006, pp. 714-719.
Yogesh Singh Chauhan, et al., "Analysis and Modeling of Lateral Non-Uniform Doping in High-Voltage MOSFETs", Tech. Digest IEDM, 2006, 4 Pages.
Mitiko Miura-Mattausch, et al., "HiSIM2: Advanced MOSFET Model Valid for RF Circuit Simulation", IEEE Transactions on Electron Devices, vol. 53, No. 9, Sep. 2006, pp. 1994-2007.

*Primary Examiner* — Paul L Rodriguez
*Assistant Examiner* — Luke Osborne
(74) *Attorney, Agent, or Firm* — Oblon, Spivak, McClelland, Maier & Neustadt, L.L.P.

(57) ABSTRACT

The drift region for increasing the breakdown voltage in an LDMOSFET is regarded as a resistive element. The potential distribution of the overall device is calculated by obtaining a potential distribution considering the resistance by iterative calculation. A capacitance generated in the drift region is analytically calculated assuming a linear potential distribution. A capacitance generated in the overlap region between the gate electrode and the drift region is calculated by considering the potential from the depletion region to the accumulation region.

2 Claims, 5 Drawing Sheets

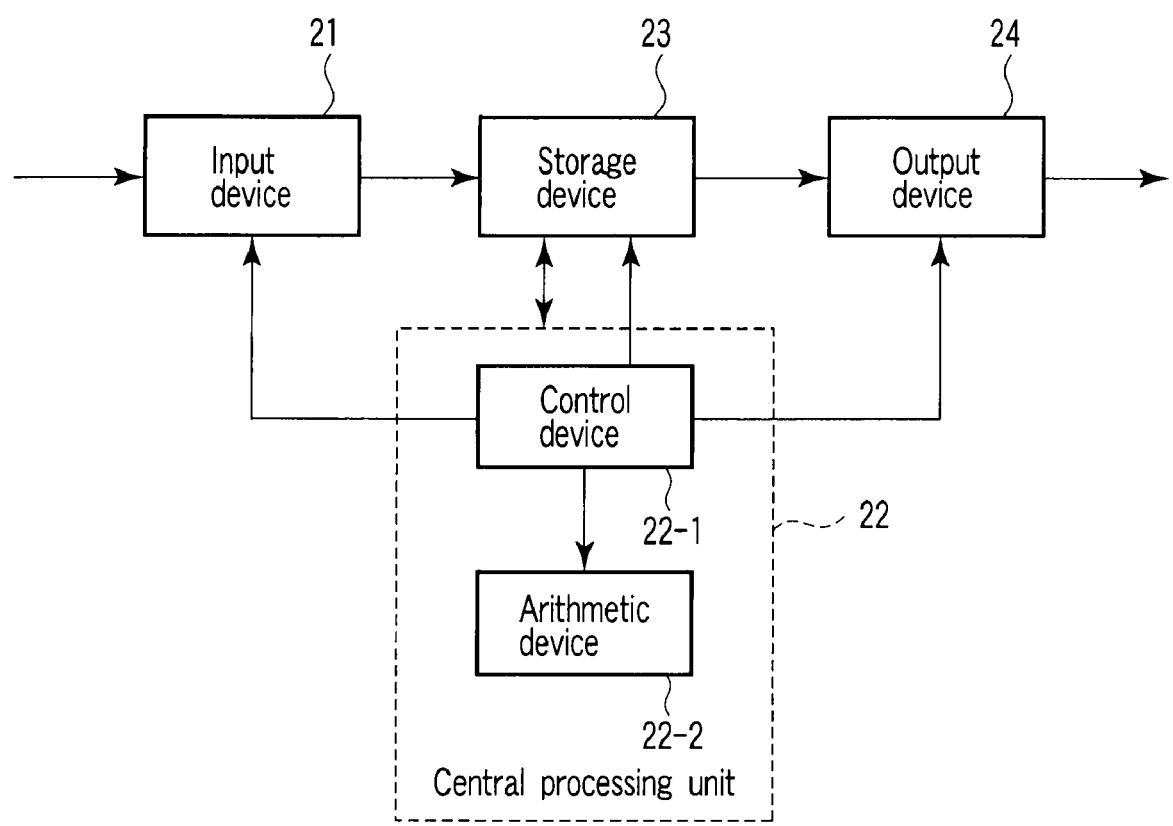
F I G. 4

SIMULATION METHOD AND SIMULATION APPARATUS FOR LDMOSFET

CROSS-REFERENCE TO RELATED APPLICATIONS

This application is based upon and claims the benefit of priority from prior Japanese Patent Application No. 2007-237184, filed Sep. 12, 2007, the entire contents of which are incorporated herein by reference.

BACKGROUND OF THE INVENTION

1. Field of the Invention

The present invention relates to a simulation method and simulation apparatus for executing device design and accurate circuit simulation of an LDMOSFET.

2. Description of the Related Art

In a normal metal-oxide-semiconductor field-effect transistor (MOSFET), the allowable applied voltage is limited to several volts. In a laterally diffused MOSFET (LDMOSFET), the applied voltage reaches several hundred volts. To ensure such a high allowable applied voltage, i.e., breakdown voltage, the LDMOSFET has a lightly doped $n^-$-region (high-resistance portion) called a drift region 13 between a drain contact 11 and a channel region 15, as shown in FIG. 6. The LDMOSFET can also set a different breakdown voltage by adjusting the length or impurity concentration in the drift region 13 or the length of an overlap region 14 between a gate electrode 12 and the drift region 13 or forming a local oxidation of silicon (LOCOS) in the drift region.

The drift region 13 serves as a resistance for a carrier that flows through a channel formed in a semiconductor substrate. Electric charges that exist in this portion are also non-negligible and induce an additional capacitance. Hence, an operation simulation model of an LDMOSFET device (to be simply referred to as an LDMOSFET device model hereinafter) requires a simulation model that accurately models the drift region and overlap region, in addition to a simulation model of a conventional MOSFET device.

To describe the characteristic of an LDMOSFET device, it is necessary to accurately describe not only an external voltage but also the voltage dependence of the internal potential of a channel end.

Conventionally, two LDMOSFET device models have been proposed. The first model includes "MM20" and "MM31" which have been developed by Philips of the Netherlands (M. B. Willemsen, R. van Langevelde, and D. B. M. Klaassen, "High-Voltage LDMOS Compact Modelling", Proc. NSTI, vol. 3, p. 714, 2006). In "MM20", an expression is defined not only for a current flowing through a channel but also for a current in a drift region. The voltage of the channel end is obtained by iterative calculation so that the two currents obtain the same value. The characteristic of an LDMOSFET device is described using the voltage. That is, separately taking the LDMOSFET device characteristic in the channel region and that in the drift region into consideration, the "MM20" and the "MM31" that describes a LOCOS portion are combined using a macro model for various breakdown voltages, thereby modeling an LDMOS device.

In the MOSFET device model, the characteristic of the LDMOSFET device is expressed by a combination of two transistors. This makes the calculation complex, and the characteristic cannot be determined uniquely.

When the drift region for raising the breakdown voltage of the LDMOSFET is considered as another transistor, the influence of the transistor performance of this portion becomes large. This departs from the device physics that an actual MOSFET is governed by carrier traveling in the channel portion. That is, it violates the principle that the MOSFET device characteristic is actually determined in the channel region.

The second model is "HV-EKV" developed by the Ecole Polytechique Federale de Lausanne, Switzerland (Y. S. Chauhan, F. Krummenacher, C. Anghel, R. Gillon, B. Bakeroot, M. Declercq, and A. M. Lonescu, "Analysis and Modeling of Lateral Non-Uniform Doping in High-Voltage MOSFETs", Tech. Digest IEDM, p. 213, 2006). In the "HV-EKV", a drift region for ensuring a high breakdown voltage is described as an external resistance using a macro model, and various characteristics except the resistance are added to this portion. However, because of simplicity and insufficient accuracy, the model cannot sufficiently describe the intrinsic device characteristic.

More specifically, the macro model of the high breakdown voltage portion includes resistances and capacitances and cannot describe the intrinsic complex voltage characteristic of the device. It is therefore impossible to reproduce the actually measured transient response.

"HiSIM" (Hiroshima-Univ. STARC IGFET Model) that is a bulk MOSFET model employs, however, a method of calculating a surface potential using a single expression for transistor (MOSFET) operations including depletion, weak inversion, and strong inversion and obtaining a current using a Poisson's equation (M. Miura-Mattausch, N. Sadachika, D. Navarro, G. Suzuki, Y. Takeda, M. Miyake, T. Warabino, Y. Mizukane, R. Inagaki, T. Ezaki, H. J. Mattausch, T. Ohguro, T. Iizuka, M. Taguchi, S. Kumashiro, and S. Miyamoto "HiSIM2: Advanced MOSFET Model Valid for RF Circuit Simulation", IEEE Trans. Electron Devices, vol. 53, p. 1994, 2006). A MOSFET voltage-current characteristic obtained by this method can satisfactorily reproduce an actually measured value by relatively simple calculation. However, the above-described modeling of a drift region or modeling of an overlap region is not taken into consideration. For this reason, the model cannot accurately cope with an LDMOSFET and must be extended to an LDMOSFET model capable of covering the structure of an LDMOSFET.

BRIEF SUMMARY OF THE INVENTION

It is therefore an object of the present invention to provide a simulation method and simulation apparatus capable of accurately simulating the characteristic of an LDMOSFET device by relatively simple calculation.

According to an aspect of the present invention, there is provided a simulation method of simulating a characteristic of a MOSFET device by a drift-diffusion model using a surface potential as a function, wherein regarding a drift region of an LDMOSFET as a resistive element, an internal potential is obtained by calculating a voltage drop caused by a resistance in the drift region by iterative calculation and used for calculation of a potential in a channel.

According to another aspect of the present invention, there is provided a simulation method of simulating a characteristic of a MOSFET device by a drift-diffusion model using a surface potential as a function, wherein a capacitance in a drift region of an LDMOSFET is described assuming that a potential changes from a channel end to a drain contact in accordance with a function of a position.

According to still another aspect of the present invention, there is provided a simulation method of simulating a characteristic of a MOSFET device by a drift-diffusion model using a surface potential as a function, wherein a capacitance in an overlap region between a gate electrode and a drift region of an LDMOSFET is obtained by calculating electric charges accumulated in the overlap region on the basis of a surface potential in inversion, a surface potential in depletion, and a surface potential in accumulation.

According to still another aspect of the present invention, there is provided a simulation method of simulating a characteristic of a MOSFET device by a drift-diffusion model using a surface potential as a function, wherein electric charges in an overlap region of an LDMOSFET are calculated and delayed, thereby simulating switching.

According to still another aspect of the present invention, there is provided a simulation method comprising a first step of inputting model parameters of an LDMOSFET, a second step of setting a gate-to-source voltage, a source-to-drain voltage, and a bulk-to-source voltage to be applied to the LDMOSFET, a third step of setting an initial value of a drain-to-source current of the LDMOSFET, a fourth step of calculating a resistance value in a drift region of the LDMOSFET on the basis of at least some of the model parameters input in the first step and at least some of the voltages set in the second step, a fifth step of calculating a voltage drop caused by the resistance value in the drift region of the LDMOSFET on the basis of the calculated resistance value in the drift region, a sixth step of calculating a potential of a source end of the LDMOSFET using a voltage that considers the calculated voltage drop by solving a Poisson's equation by iterative calculation, a seventh step of calculating a potential of a channel end of the LDMOSFET using the voltage that considers the calculated voltage drop by solving the Poisson's equation by iterative calculation, an eighth step of calculating the drain-to-source current of the LDMOSFET, a ninth step of determining whether an absolute value of a difference between the drain-to-source current used in calculation in the fifth step and the drain-to-source current calculated in the eighth step is not more than a predetermined calculation error, a 10th step of calculating charge densities and capacitances when the absolute value is determined in the ninth step to be smaller than the calculation error, and an 11th step of substituting the drain-to-source current calculated in the eighth step into the drain-to-source current to be used for calculation in the fifth step when the absolute value is determined in the ninth step to be not less than the calculation error, wherein after executing the 11th step, the fifth to ninth steps are repeated.

According to still another aspect of the present invention, there is provided a simulation apparatus comprising input means for inputting at least one of model parameters of an LDMOSFET, a gate-to-source voltage, a source-to-drain voltage, and a bulk-to-source voltage to be applied to the LDMOSFET, and an initial value of a drain-to-source current of the LDMOSFET, processing means for executing arithmetic processing of calculating a resistance value in a drift region of the LDMOSFET, a voltage drop caused by the resistance value in the drift region, a potential of a source end, a potential of a channel end, and the drain-to-source current of the LDMOSFET on the basis of the model parameters of the LDMOSFET, the gate-to-source voltage, the source-to-drain voltage, and the bulk-to-source voltage of the LDMOSFET, and the initial value of the drain-to-source current of the LDMOSFET, which are input by the input means, storage means for storing the model parameters of the LDMOSFET, the gate-to-source voltage, the source-to-drain voltage, and the bulk-to-source voltage of the LDMOSFET, and the initial value of the drain-to-source current of the LDMOSFET which are input by the input means, a program which describes an expression based on drift-diffusion approximation by a surface potential model, a program which describes an arithmetic expression for calculating the resistance value in the drift region of the LDMOSFET, a program which describes an arithmetic expression for calculating the voltage drop caused by the resistance in the drift region of the LDMOSFET, a program which describes an arithmetic expression for calculating the potential of the source end of the LDMOSFET, a program which describes an arithmetic expression for calculating the potential of the channel end of the LDMOSFET, a program which describes an arithmetic expression of the drain-to-source current of the LDMOSFET, and an arithmetic result calculated by the processing means, and output means for outputting the result calculated by the processing means, wherein the processing means calculates the resistance value in the drift region in accordance with the program which describes the expression based on drift-diffusion approximation by the surface potential model, and the program which describes the arithmetic expression for calculating the resistance value in the drift region of the LDMOSFET, which are stored in the storage means to calculate a drain-to-source current of an MOSFET, calculates the voltage drop caused by the resistance in the drift region of the LDMOSFET in accordance with the program which describes the arithmetic expression for calculating the voltage drop caused by the resistance in the drift region of the LDMOSFET, on the basis of the calculated resistance value in the drift region, calculates the potential of the source end of the LDMOSFET by solving a Poisson's equation by iterative calculation in accordance with the program which describes the arithmetic expression for calculating the potential of the source end of the LDMOSFET, calculates the potential of the channel end of the LDMOSFET by solving a Poisson's equation by iterative calculation in accordance with the program which describes the arithmetic expression for calculating the potential of the channel end of the LDMOSFET, calculates the drain-to-source current of the LDMOSFET in accordance with the program which describes the arithmetic expression of the drain-to-source current of the LDMOSFET, determines whether an absolute value of a difference between the calculated drain-to-source current and the initial value of the drain-to-source current input by the input means is not more than a predetermined calculation error, and upon determining that the absolute value is smaller than the calculation error, calculates charge densities and capacitances, and upon determining that the absolute value is not less than the calculation error, substitutes the calculated drain-to-source current into the set initial value of the drain-to-source current.

BRIEF DESCRIPTION OF THE SEVERAL VIEWS OF THE DRAWING

FIG. 4 is a block diagram showing the schematic arrangement of a simulation apparatus according to the first embodiment of the present invention;

DETAILED DESCRIPTION OF THE INVENTION

The outline of an LDMOSFET model used in the present invention and the process of examinations to the model will be described first. Then, a simulation method and simulation apparatus according to the embodiment using the LDMOSFET model will be explained.

The basic concept of the present invention will be described.

The HiSIM has already considered the potential of the channel end. Hence, it is possible to cope with an LDMOS model using the same model as the conventional MOS model. A drift region for increasing the breakdown voltage of an LDMOSFET is regarded as a resistive element. A potential distribution considering the resistance in the drift region is obtained by iterative calculation, thereby calculating the potential distribution of the overall device. The model can cope with various breakdown voltages by changing the resistance in the drift region. A capacitance generated in the drift region is analytically solved by assuming the potential distribution of a function of the position. The function of the position is a function based on the position of the drift region. A capacitance generated in the overlap region between the gate electrode and the drift region is calculated by considering the potential from depletion to accumulation.

An extended model (to be referred to as an "HiSIM-LDMOS model" hereinafter) obtained by applying the characteristic model of an MOSFET device of HiSIM to an LDMOSFET will be described next.

<Outline of HiSIM-LDMOS Model>

Figure 1:
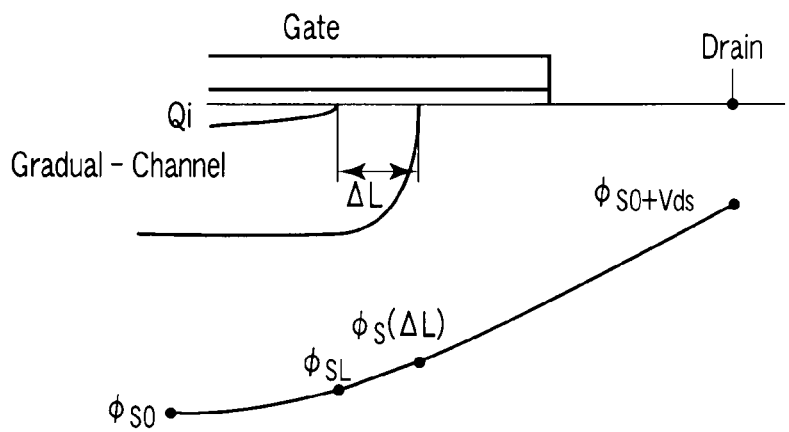
FIG. 1 is a schematic view for explaining an HiSIM-MOS model and a surface potential.

In the HiSIM, a MOSFET device characteristic model is formed based on a surface potential. In the HiSIM-LDMOS model, a potential $\phi_{S0}$ of the source end, a potential $\phi_{SL}$ of a channel end (pinch-off point), and a potential $\phi_{S(\Delta L)}$ of the channel/drain junction portion are recognized, as shown in FIG. 1. The relationship between them is given by $$\phi_{S(\Delta L)} = (1 - CLM1) * \phi_{SL} + CLM1 * (\phi_{s0} + V_{ds}') \quad (1)$$

where $V_{ds}'$ is the internal voltage between the source and the channel/drain junction end, and CLM1 is a model parameter.

In Expression 1, various channel/drain junction conditions can be described by appropriately fitting the model parameter CLM1.

In the following description, $V_{ds}$ (without a prime) is the input voltage between the source and drain, and $V_{ds}'$ (with a prime) is the internal voltage between the source and the channel/drain junction end.

Hence, in the HiSIM, the potential $\phi_{S(\Delta L)}$ of the channel/drain junction portion necessary for the LDMOS model is already taken into consideration.

In the MOSFET device characteristic model, the potential $\phi_{S(\Delta L)}$ of the channel/drain junction portion is calculated under a condition 1>CLM1>0.5. In the HiSIM-LDMOS model as well, the potential is calculated under the same condition.

Figure 2A:
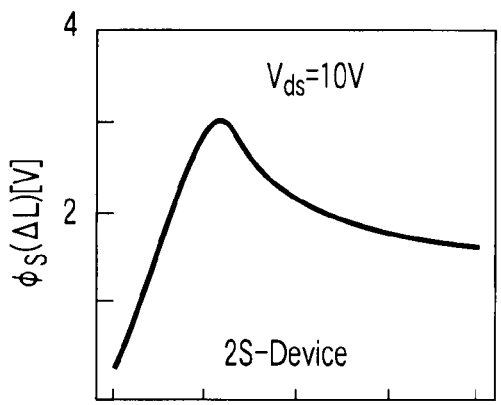
FIGS. 2A and 2B are graphs showing simulation results of a general two-dimensional simulation apparatus for semiconductor device design as a comparative example so as to explain a potential drop in a drift region.
Figure 2B:
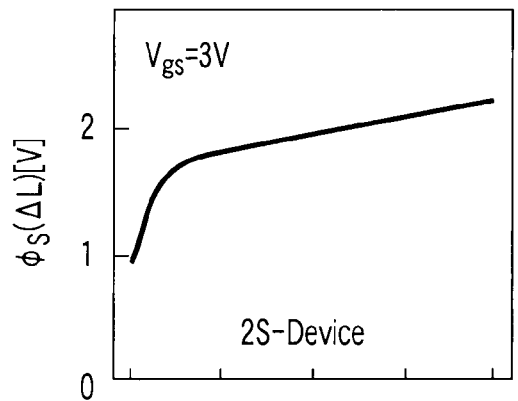
Figure 2C:
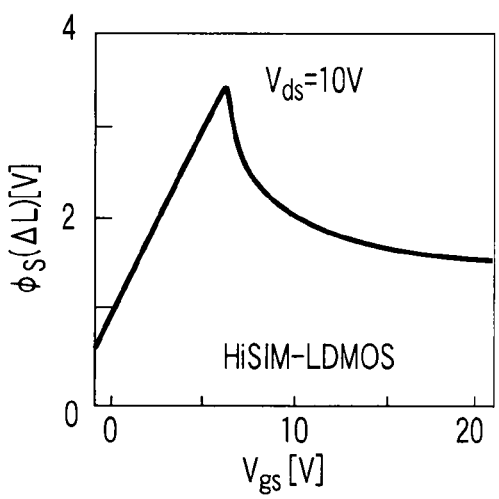
FIGS. 2C and 2D are graphs showing simulation results using an HiSIM-LDMOS model so as to explain a potential drop in a drift region.
Figure 2D:
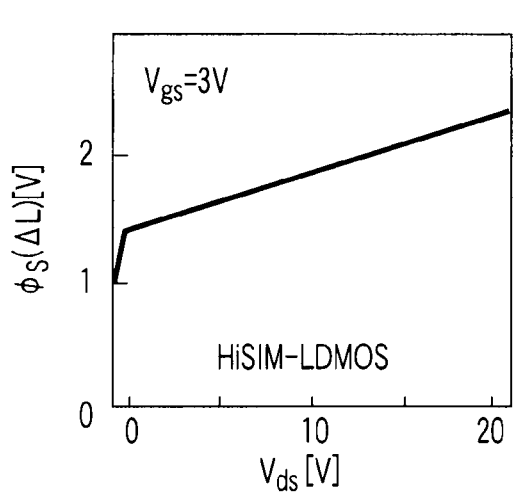

FIGS. 2C and 2D show results obtained by a simulation apparatus using an HiSIM-LDMOS model based on Expression 1 (to be simply referred to as an "HiSIM-LDMOS simulator" hereinafter). FIGS. 2A and 2B show simulation results obtained by a general two-dimensional simulation apparatus for semiconductor device design (to be simply referred to as a "2D device simulator" hereinafter) as a comparative example.

Each of FIGS. 2A and 2C shows the relationship between an internal voltage ($V_{gs}'$) between the gate and source and the potential $\phi_{S(\Delta L)}$ of the channel/drain junction portion when the input voltage ($V_{ds}$) between the source and drain is 10V.

Each of FIGS. 2B and 2D shows the relationship between the internal voltage ($V_{ds}'$) between the source and the channel/drain junction end and the potential $\phi_{S(\Delta L)}$ of the channel/drain junction portion when an input voltage ($V_{gs}$) between the gate and source is 3V.

As is apparent from comparison between FIG. 2A and FIG. 2C and that between FIG. 2B and FIG. 2D, the HiSIM-LDMOS simulator reproduces the abrupt potential drop (voltage drop) in the drift region, which is characteristic in the LDMOSFET, more appropriately.

<Modeling of Drift Region>

A charge density ($Q_{drift}$) in the drift region is calculated by $$LdLD = \frac{L_{drift}}{2}\left[1 + \tanh\left\{\frac{1}{2}V_{gs} - V_{th} - DLD\right\}\right] \quad (2)$$

$$E_{drift} = \frac{V_{ds} + \phi_{s0} - \phi_{s(\Delta L)}}{LdLD}$$

$$Q_{drift} = QDFTMAG * W_{eff} * LdLD * \frac{I_{dd}}{E_{drift}}$$

More specifically, the drift region of the LDMOSFET has a high resistance. In this case, assuming that the electric field in the drift region is constant, a density $I_{dd}$ of a carrier flowing from the channel is divided by the electric field in the drift region.

In Expression 2, the input and internal voltages are discriminated by the presence/absence of "'" (prime). The internal voltage has "'", and the input voltage does not have "'". This also applies to the remaining expressions.

In Expression 2, tanh is a function added to obtain a smooth voltage dependence, $E_{drift}$ is the electric field in the drift region, and DLD is a constant parameter which models that the gate voltage modulates the overlap capacitance. QDFTMAG is a parameter used to reproduce the actually measured capacitance (a constant to adjust a capacitance peak by simulation), LdLD is an intermediate parameter, $V_{ds}$ is the input voltage value between the source and drain, $V_{gs}$ is the input voltage value between the gate and source, $V_{th}$ is a predetermined threshold voltage value, $L_{drift}$ is a constant parameter representing the length of the drift region, and $W_{eff}$ is a constant parameter representing the length of a single channel width. The remaining values are based upon Expression 1.

<Accurate Modeling of Overlap Region>

A charge density $Q_{over}$ of electric charges accumulated in the overlap region will be modeled next.

In the HiSIM-LDMOS model, all of inversion, depletion, and accumulation in the LDMOSFET will be examined.

When the gate voltage of the LDMOSFET rises and exceeds a flat-band voltage, depletion occurs, and the state gradually changes to accumulation. For each case, the charge density ($Q_{over}$) of electric charges accumulated in the overlap region is modeled using $$Q_{over} = \text{WEFF\_NF} * LOVERLD \qquad (3)$$

$$\sqrt{2 * \varepsilon_{si} * NOVER * KT} \sqrt{\frac{(\phi_{s0} + V_{ds}) * q}{KT} - 1.0}$$

$$Q_{over} = \text{WEFF\_NF} * LOVERLD * C_{OX} * (-V'_{gs} - V_{fbover} - \phi_{s0}) \qquad (4)$$

where WEFF_NF is a constant parameter representing the sum of the lengths of channel widths of all channels. More specifically, WEFF_NF=$W_{eff}$ (the length of a single channel width)*NF (the total number of fingers). LOVERD is the length of the overlap region, NOVER is the impurity concentration in the drain junction region, $\varepsilon_{si}$ is the dielectric constant of silicon, K is the Boltzmann's constant, T is the absolute temperature, $V_{ds}$ is the input voltage value between the source and drain, q is the elementary charge amount, $C_{OX}$ is the gate oxide film capacitance, $V_{gs}$ is the input voltage value between the gate and source, $V_{gs}'$ is the internal voltage value between the gate and source, and $V_{fbover}$ is the flat-band voltage value in the drain.

More specifically, the charge density ($Q_{over}$) in inversion and depletion is represented by Expression 3. The charge density ($Q_{over}$) in accumulation is represented by Expression 4. Based on these model expressions, the surface potential $\phi_{S0}$ in the overlap region in each case is calculated. At this time, the HiSIM model calculates the channel portion in a p-type semiconductor substrate. Since the drift region is made of an n-type semiconductor, the input voltage $V_{gs}$ between the gate and source is handled as a negative value.

Figure 3A:
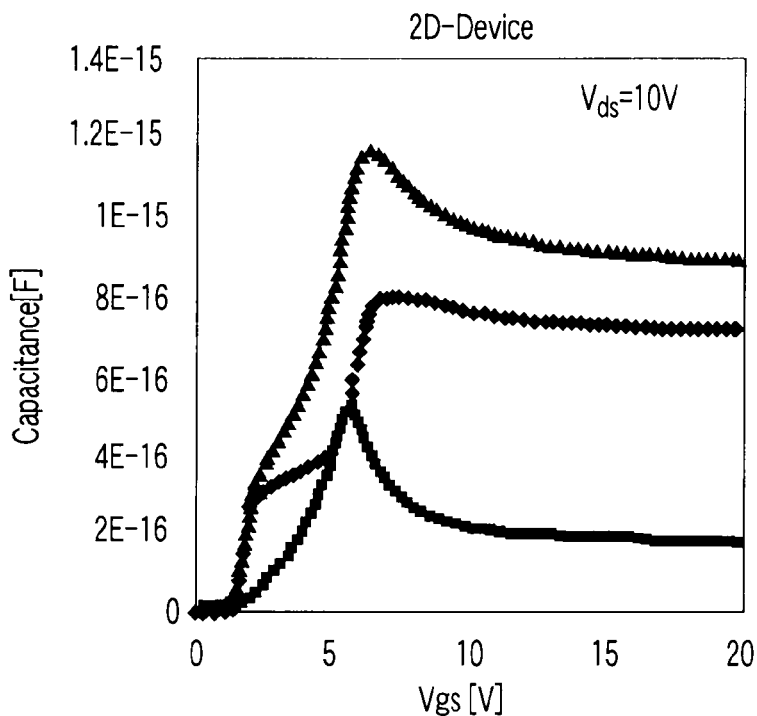
FIG. 3A is a graph showing the relationship between a gate voltage and a capacitance in a 2D device simulator.
Figure 3B:
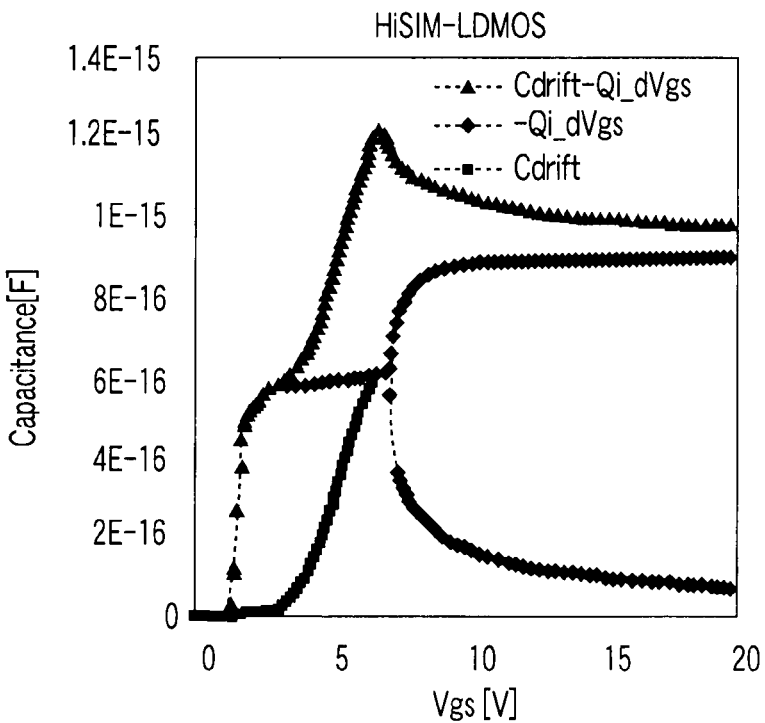
FIG. 3B is a graph showing the relationship between a gate voltage and a capacitance in an HiSIM-LDMOS model.

FIGS. 3A and 3B show simulation results of the capacitance generated by the charge density ($Q_{drift}$) in the drift region and the charge density ($Q_{over}$) in the overlap region. The relationships between the capacitance and the input voltage ($V_{gs}$) between the gate and source are shown by comparison. The input voltage value ($V_{ds}$) between the source and drain is set at 10V.

FIG. 3A shows a simulation result of the 2D device simulator. FIG. 3B shows a simulation result of the HiSIM-LDMOS simulator using Expression 2.

That is, as compared to the 2D device simulator, the HiSIM-LDMOS simulator which reproduces the sharp peak characteristic for the LDMOSFET can perform simulation close to the actually measured value, as shown in FIG. 3B.

The above-described method enables to more accurately model the charge density in the drift region and that in the overlap region using the HiSIM-LDMOS model. Additionally, a model is described in consideration of characteristics 1 to 3.

(i) Quasi-Saturation Characteristic

The LDMOSFET ensures a high breakdown voltage by absorbing a voltage applied to the high-resistant drift region. That is, when the input drain voltage rises, almost all the voltage causes a potential drop in the drift region. In this case, the Id-Vd characteristic (the relationship between the drain current and the input drain voltage) does not exhibit the saturation state unique to the MOSFET. Instead, a so-called quasi-saturation characteristic is obtained so that the current slowly increases even when the voltage exhibits the saturation state.

(ii) Capacitance Characteristic Induced by Potential Drop

The capacitance characteristic exhibits a complex behavior because a capacitance induced by the potential drop in the drift region is added to the capacitance of a normal MOSFET.

(iii) Non-Quasi-Static Characteristic

The LDMOSFET is generally used as a switching device and therefore has a characteristic that causes a delay in charging, which is called a non-quasi-static effect, in addition to accurate current and capacitance models.

Of the above-described three requirements, characteristics i and ii are solved by [1] modeling the resistance in the drift region and [2] modeling the capacitance generated by the potential drop in the drift region, i.e., regarding the drift region as a resistance and calculating the base quantity of model description while taking the resistance value into consideration by iterative calculation.

Characteristic iii is solved by [3] modeling the response delay of electric charges in the drift region and [4] modeling the carrier traveling time in the overlap region, i.e., delaying electric charges in the overlap region that is a part of the drift region, assuming that the delay generated in the drift region plays an important role.

The above-described modeling methods 1 to 4 will be described below in detail.

[1] Modeling of Resistance in Drift Region

To model the resistance in the drift region, first, a voltage drop caused by a resistance value ($R_{drift}$) in the drift region is obtained by iterative calculation for the input voltage value ($V_{ds}$) between the source and drain, thereby obtaining the internal voltage value ($V_{ds}'$) between the source and the channel/drain junction end.

$$R_{drift2} = f(R_d, V_{gs}, V_{ds}) \qquad (5)$$

$$= (R_d + V_{ds} * R_{DVD}) * \left(1 + RDVG11 - \frac{RDVG11}{RDVG12} * V_{gs}\right)$$

$$V'_{ds} = V_{ds} - I_{ds} * (R_{drift2} + R_s) \qquad (6)$$

$$R_d = \frac{1}{W_{eff}}(R'_d * V_{ds}^{RD21} + V_{bs} * RD22) \qquad (7)$$

$$R_{DVD} = \frac{RDVD}{W_{eff}} * \exp(-RDVDL * (L_{gate} * 10^4)^{RDVDLP})$$

$$\left(1 + \frac{RDVDS}{(W_{gate} * 10^4 * L_{gate} * 10^4)^{RDVDSP}}\right)$$

$$R'_d = RD23'$$

$$RD23' = RD23 * \exp(-RD23L * (L_{gate} * 10^4)^{RD23LP})$$

$$\left(1 + \frac{RD23S}{(W_{gate} * 10^4 * L_{gate} * 10^4)^{RD23SP}}\right)$$

$$I_{ds} = I_{ds0} * \frac{1}{1 + R_{drift2} * \frac{I_{ds0}}{V_{ds}}} \qquad (8)$$

where $R_{Drift2}$ is an intermediate parameter, $R_d$ is the resistance value in the drift region, $V_{gs}$ is the input voltage between the gate and source, $V_{ds}$ is the input voltage value between the source and drain, $R_{DVD}$ is an intermediate parameter, $I_{ds}$ is an intermediate parameter (drain-to-source current value), $R_s$ is the resistance value on the source-side overlap region, $I_{ds0}$ is the current value between the drain and source when the resistance is neglected, $L_{gate}$ is the gate length, $W_{gate}$ is the gate width, and $W_{eff}$ is a constant parameter representing the length of a single channel width.

Expressions 5 and 6 use the input voltage values ($V_{gs}$ and $V_{ds}$). However, the internal voltages ($V_{gs}'$ and $V_{ds}'$) may be used.

Iterative calculation is performed until the drain-to-source current value Ids in Expression 6 obtains the same value as $I_{ds}$ calculated by Expression 8.

$I_{ds0}$ calculated using the internal voltage value ($V_{ds}'$) between the source and drain can be finely adjusted using an analytic expression.

In the above expressions, RDVD, RDVG11, RDVG12, RD21, RD22, RD23, RD23L, RD23LP, RD23S, RD23SP, RDVDL, RDVDLP, RDVDS, and RDVDSP are model parameters. The descriptions of the dependence of the resistance value ($R_{drift2}$) in the drift region, the input voltage value ($V_{gs}$) between the gate and source, and the input voltage value ($V_{ds}$) between the source and the channel/drain junction are not limited to these functions.

[2] Modeling of Capacitance Generated by Potential Drop in Drift Region

To model the capacitance generated by the potential drop in the drift region, first, the charge density ($Q_{drift}$) in the drift region is modeled. At this time, since the drift region has a high resistance, the electric field ($E_{drift}$) is assumed to be constant.

$$Q_{drift} = QDFTMAG * W_{eff} * NF * L_{drift} \frac{I_{dd}}{\beta * E_{drift}} \quad (9)$$

where NF is the number of fingers, and β is kT/q (the reciprocal of a thermal voltage). The remaining parameters are the same as in Expression 2.

$$E_{drift} = \frac{V_{ds} + VBI - \phi_{s(\Delta L)}}{L_{drift}} \quad (10)$$

$$L_{drift} = LDRIFT \frac{1 + \tanh 0.5(V_{gs} - V_{th} - DLD)}{2} \quad (11)$$

In Expression 9, $I_{dd}$ is an amount calculated by the HiSIM by multiplying an electric field applied to all carriers in the channel, QDFTMAG, VBI, LDRIFT, and DLD are model parameters, and NF is an instance parameter common to the HiSIM.

The electric charges are assigned to each electrode such that the principle of charge conservation is satisfied. Then, the capacitances (gate-to-bulk capacitance $\Delta C_{gb}$, gate-to-drain capacitance $\Delta C_{gd}$, gate capacitance $\Delta C_{gg}$, and other capacitances) are calculated by $$\Delta C_{gb} = \frac{\partial Q_{drift}}{\partial V_{bs}} \quad (12)$$

where $V_{bs}$ is the input voltage value between the base and source.

$$\Delta C_{gd} = \frac{\partial Q_{drift}}{\partial V_{ds}} \quad (13)$$

where $V_{ds}$ is the input voltage value between the source and drain.

$$\Delta C_{gg} = \frac{\partial Q_{drift}}{\partial V_{gs}} \quad (14)$$

where $V_{gs}$ is the input voltage value between the gate and source.

[3] Modeling of Response Delay of Electric Charges in Drift Region (General Expression in Time Domain)

The response delay of electric charges at a predetermined time (t) of transient analysis is modeled. The initial value of electric charges is formalized by $$q_{NQS}(ti) = Q_{QS}(ti) \quad (15)$$

where $q_{NQS}$ is the charge density considering a delay, and $Q_{QS}$ is the charge density considering a delay. Calculation at each time (ti) during transient analysis is $$q_{NQS}(ti) = q_{NQS}(ti) + (\Delta t/(\Delta t + \tau))\{Q_{QS}(ti) - q_{NQS} (t_{previous})\} \quad (16)$$

where $t_{previous}$ is a time immediately before the time (ti) of analysis. Then, $$\Delta t = ti - t_{previous} \quad (17)$$

In Expression 16, Δt in the second term is added to implement stable simulation, which can be either present or absent, or can be deformed.

[4] Modeling of Carrier Traveling Time in Overlap Region

Modeling of the carrier traveling time in the overlap region is done by $$\tau_{over} = DLYOV * (Q_{over}/I_{ds}) \quad (18)$$

where $\tau_{over}$ is the time necessary for accumulating overlap charges, and DLYOV is a model parameter.

[Simulation Method Using Computer]

Figure 5:
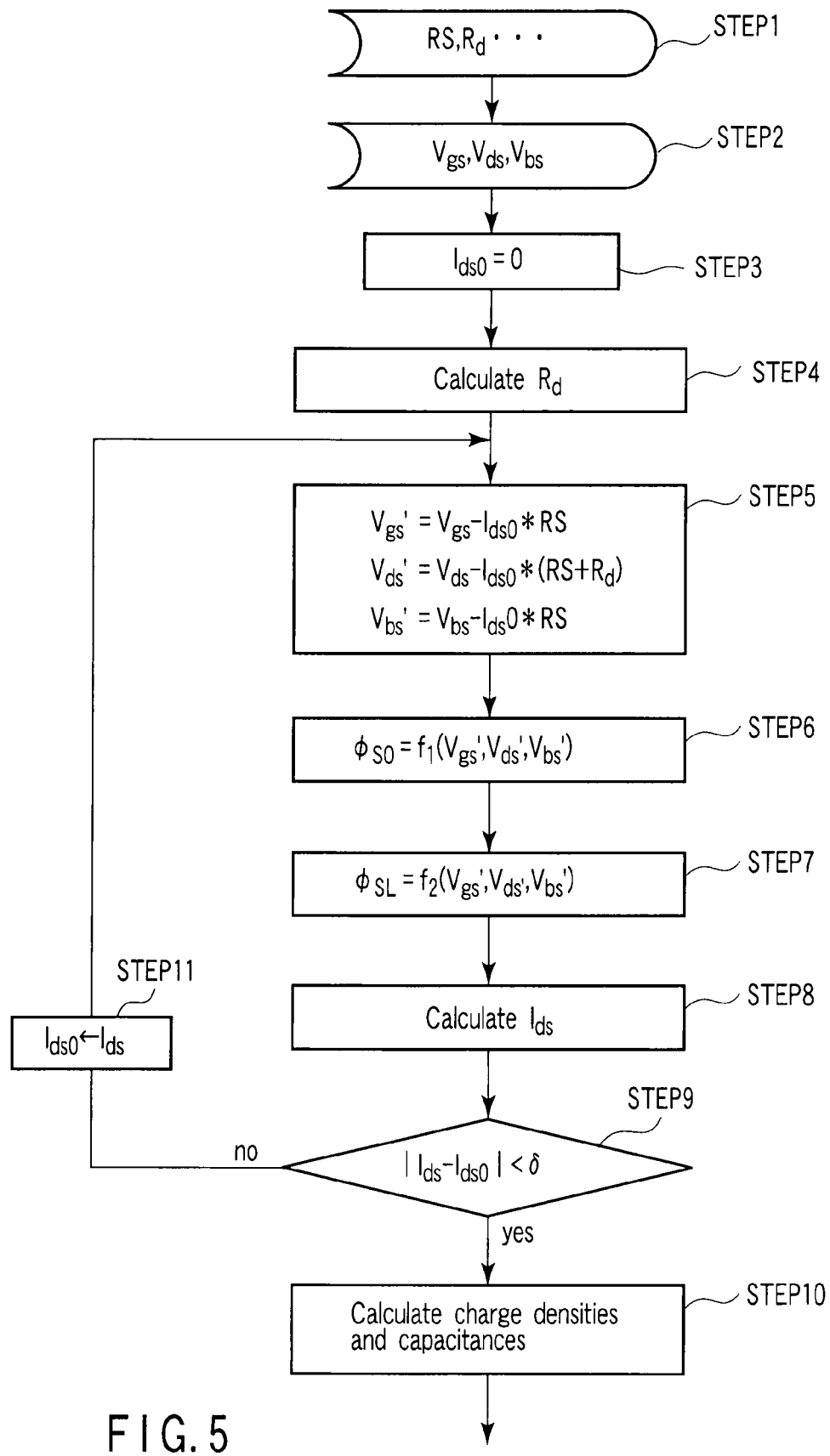
FIG. 5 is a flowchart illustrating a simulation method according to the first embodiment of the present invention.
Figure 6:
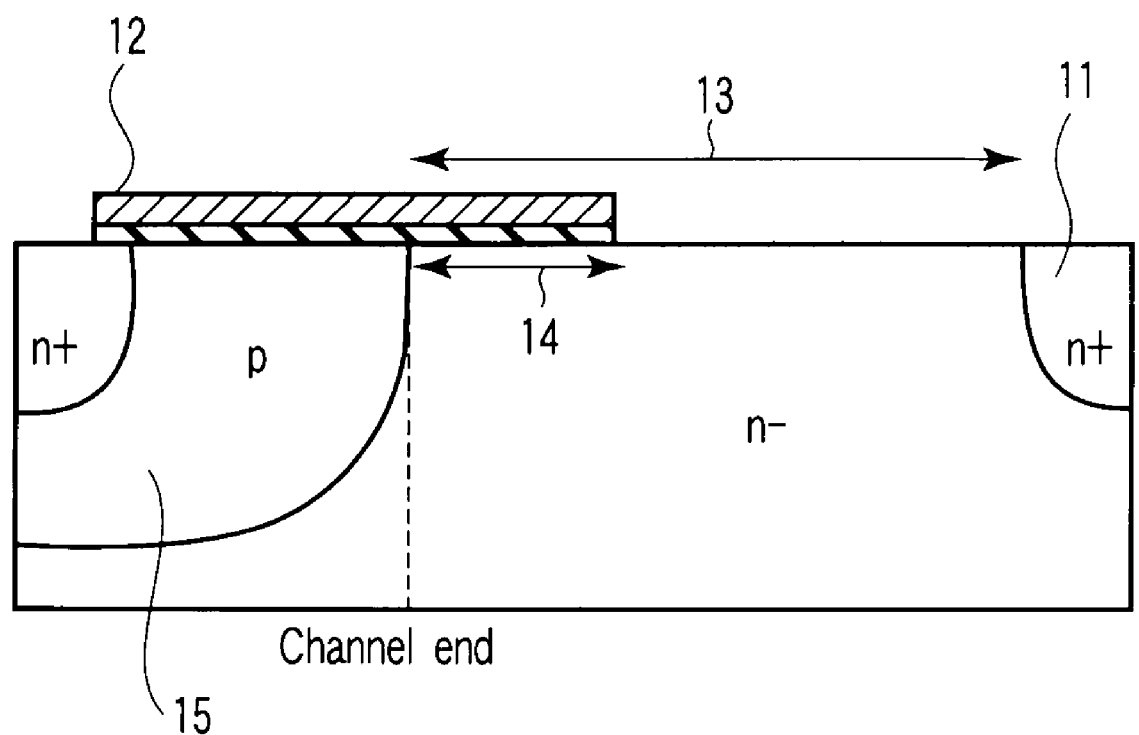
FIG. 6 is a sectional view showing the structure of an LDMOSFET.

A simulation method and simulation apparatus according to the embodiment of the present invention using the HiSIM-LDMOS model will be described next with reference to FIGS. 4 and 5. FIG. 4 is a block diagram showing the schematic arrangement of a simulation apparatus according to the first embodiment of the present invention. FIG. 5 is a flowchart illustrating a simulation method according to the first embodiment of the present invention.

As shown in FIG. 4, the simulation apparatus includes an input device 21 such as a keyboard or operation panel, a central processing unit 22 which executes various kinds of processes, a storage device 23 such as a memory circuit, semiconductor memory, or hard disk, and an output device 24 such as a display device or printer. The central processing unit 22 includes a control device 22-1 and an arithmetic device 22-2. The control device 22-1 controls the operations of the input device 21, arithmetic device 22-2, storage device 23, and output device 24.

The storage device 23 stores programs which describe the arithmetic expressions and relational expressions in the above-described HiSIM-LDMOS model. The storage device 23 stores, e.g., a program which describes an expression based on drift-diffusion approximation by a surface potential model, a program which describes an arithmetic expression for calculating the resistance value in the drift region of the LDMOSFET, a program which describes an arithmetic expression for calculating the voltage drop caused by the resistance in the drift region of the LDMOSFET, a program which describes an arithmetic expression for calculating the potential of the source end of the LDMOSFET, a program which describes an arithmetic expression for calculating the potential of the channel end of the LDMOSFET, and a program which describes an arithmetic expression of the drain-to-source current of the LDMOSFET. The storage device 23 also stores device parameters input from the input device 21 and the initial values of parameters (they may be stored in advance), and arithmetic results of the arithmetic device 22-2.

As shown in the flowchart in FIG. 5, first, the input device 21 inputs various kinds of parameters which are characteristic values representing the structure of an LDMOS device as a simulation target and are used in the above-described modeling expressions (Step 1). The parameters include the resistance value (RS) in the source-side overlap region, the resistance value ($R_d$) in the drift region, the length ($L_{drift}$) of the drift region, and the length (LOVERD) of the overlap region.

Voltages such as the gate-to-source voltage $V_{gs}$, the source-to-drain input voltage $V_{ds}$, and the bulk-to-source input voltage $V_{bs}$, which are to be applied to the LDMOSFET to perform simulation, are set (Step 2).

The initial value $I_{ds0}$ of the drain-to-source current is set ($I_{ds0}$=0) (Step 3).

The data of the model parameters of the LDMOSFET input from the input device 21, the gate-to-source voltage, source-to-drain voltage, bulk-to-source voltage of the LDMOSFET, and the initial value of the drain-to-source current of the LDMOSFET are stored in the storage device 23 under the control of the control device 22-1.

The model parameters of the LDMOSFET, the gate-to-source input voltage $V_{gs}$ and the source-to-drain input voltage $V_{ds}$ of the LDMOSFET, and the program which describes the arithmetic expression for calculating the resistance value $R_d$ in the drift region of the LDMOSFET, which are stored in the storage device 23, are transferred to the arithmetic device 22-2 under the control of the control device 22-1. The computer program calculates Expression 7 and its associated expressions, thereby obtaining the resistance value ($R_d$) in the drift region (Step 4). The arithmetic result is transferred to and saved in the storage device 23.

After that, using the calculated resistance value $R_d$ in the drift region, the device parameters and voltage value set data stored in the storage device 23, and the program which describes the arithmetic expression for calculating the voltage drop caused by the resistance in the drift region of the LDMOSFET, arithmetic processing is executed using $$V_{gs}' = V_{gs} - I_{ds0} * RS$$

$$V_{ds}' = V_{ds} - I_{ds0} * (RS + R_d)$$

$$V_{bs}' = V_{bs} - I_{ds0} * RS$$

This calculates the potential drop based on the resistance value ($R_d$) in the drift region (Step 5).

The central processing unit 22 solves the Poisson's equation by iterative calculation on the basis of the program which describes the arithmetic expression for calculating the potential $\phi_{S0}$ of the source end of the LDMOSFET, which is stored in the storage device 23, thereby calculating the potential of the source end (Step 6).

$$\phi_{S0} = f_1(V_{gs}', V_{ds}', V_{bs}')$$

Next, the central processing unit 22 solves the Poisson's equation by iterative calculation on the basis of the program which describes the arithmetic expression for calculating the potential $\phi_{SL}$ of the channel end of the LDMOSFET, thereby calculating the potential of the channel end (Step 7).

$$\phi_{SL} = f_2(V_{gs}', V_{ds}', V_{bs}')$$

The arithmetic results are stored in the storage device 23.

Next, the central processing unit 22 calculates the drain-to-source current value $I_{ds}$ on the basis of the program which describes the arithmetic expression of the drain-to-source current of the LDMOSFET and is stored in advance in the storage device 23, i.e., Expression 8 and its associated expressions (Step 8). The arithmetic result is stored in the storage device 23.

The central processing unit 22 determines whether the absolute value of the difference between the drain-to-source current $I_{ds}$ calculated in Step 8 and the initial value of the drain-to-source current $I_{ds0}$ stored in the storage device 23 is smaller than a bulk coefficient $\delta$ (Step 9). The bulk coefficient indicates a calculation error.

$$|I_{ds} - I_{ds0}| < \delta$$

When this condition is satisfied, the central processing unit 22 calculates the charge densities and capacitances (Step 10). In calculating the charge densities and capacitances, the capacitance generated in the drift region is analytically calculated assuming a linear potential distribution. The capacitance generated in the overlap region between the gate electrode and the drift region is calculated by considering the potential from the depletion region to the accumulation region.

When the condition is not satisfied, i.e., the absolute value ($|I_{ds} - I_{ds0}|$) of the difference between the drain-to-source current $I_{ds}$ calculated in Step 8 and the initial value of the drain-to-source current $I_{ds0}$ stored in the storage device 23 is equal to or larger than the bulk coefficient $\delta$, $I_{ds}$ is substituted into $I_{ds0}$ (Step 11).

The process returns to Step 5 to calculate the potential drop based on the resistance value $R_d$. The operations in Steps 5, 6, 7, 8, 9, and 11 are repeated until the central processing unit 22 determines that $|I_{ds} - I_{ds0}|$ is smaller than the bulk coefficient $\delta$. Upon determining that $|I_{ds} - I_{ds0}|$ is smaller than the bulk coefficient $\delta$, the central processing unit 22 calculates the charge densities and capacitances (Step 10).

The above-described HiSIM-LDMOS model implements calculation that accurately reflects the complex voltage dependence of the resistance in the drift region by solving Poisson's equation faithfully by iterative calculation. This ensures high accuracy.

Additionally, involvement of a resistance is solved in the model by iterative calculation without forming an external node.

The characteristic of the LDMOSFET is described using the resistance in the drift region. It is possible to implement an accurate model by using the potential drop caused by the resistance to the model of the drift region. In addition, the model can cope with various breakdown voltage devices by changing the resistance value in the drift region.

Hence, the simulation apparatus and simulation method having the above-described arrangement reflects, on the model, device quantities such as the impurity concentration and length of the drift region and the concentration in the channel portion, which determine the breakdown voltage of the LDMOSFET. In other words, the model is developed based on the device physics. It is therefore possible to accurately simulate the characteristic of the LDMOSFET device by relatively simple calculation. Additionally, the model which is developed using the structural parameters of a MOSFET can easily cope with a change in the structure.

It is therefore possible to design and manufacture an LDMOSFET by reflecting the MOSFET model and simulation result on device design and adjusting various device parameters and set voltages in a MOSFET.

As described above, according to an aspect of the present invention, it is possible to obtain a simulation method and simulation apparatus capable of accurately simulating the characteristic of an LDMOSFET device by relatively simple calculation.

The device structure of the LDMOSFET has a high degree of freedom. Hence, the structure can be determined by simulation, and the circuit characteristic can be evaluated simultaneously. This reduces the development cost. Additionally, there is a great demand for the LDMOSFET, and the present invention can cope with various application purposes.

The present invention has been described above in accordance with the embodiment. However, the present invention is not limited to the above embodiment, and in practicing the present invention, various changes and modifications can be made without departing from the spirit and scope of the invention. For example, the simulation method and simulation apparatus described above are applied to only the LDMOSFET model. However, the basic part of the LDMOSFET model is common to a MOS model. For this reason, the method and apparatus can cope with both of the MOSFET and LDMOSFET by selectively setting a flag for calculating capacitances in the drift region which are necessary for only the LDMOSFET. The method and apparatus can also simulate a circuit including both the MOSFET and LDMOSFET.

Various expressions described above are merely forms for expressing the technical idea of present invention, as a matter of course. For example, a coefficient for biasing a parameter element may be introduced. Even discrete expressions for causing a computer program to implement the same technical idea does not depart from the spirit and scope of the present invention, as a matter of course.

As described above, according to one aspect of the present invention, it is possible to obtain a simulation method and simulation apparatus capable of accurately simulating the characteristic of an LDMOSFET device by relatively simple calculation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A simulation method comprising:
a first step of inputting model parameters of a lateral diffused MOSFET (LDMOSFET) from an input device, wherein the model parameters include at least a resistance value of overlap region of a source side and a resistance value of a drift region;
a second step of inputting voltages to be applied to the LDMOSFET from the input device, wherein the voltages include a gate-to-source voltage, a source-to-drain voltage, and a bulk-to-source voltage;
a third step of inputting an initial value of a drain-to-source current of the LDMOSFET from the input device;
a fourth step of calculating, using a central processing unit, the resistance value in the drift region of the LDMOSFET on the basis of at least some of the model parameters input in the first step and at least some of the voltages set in the second step;
a fifth step of calculating, using the central processing unit, a voltage drop caused by the resistance value in the drift region of the LDMOSFET on the basis of the calculated resistance value in the drift region;
a sixth step of calculating, using the central processing unit, a potential of a source end of the LDMOSFET using a voltage that considers the calculated voltage drop by solving a Poisson's equation by iterative calculation;
a seventh step of calculating, using the central processing unit, a potential of a channel end of the LDMOSFET using the voltage that considers the calculated voltage drop by solving the Poisson's equation by iterative calculation;
an eighth step of calculating, using the central processing unit, the drain-to-source current of the LDMOSFET;
a ninth step of determining whether an absolute value of a difference between the drain-to-source current used in calculation in the fifth step and the drain-to-source current calculated by the central processing unit in the eighth step is not more than a predetermined calculation error;
a 10th step of calculating charge densities and capacitances by the central processing unit when the absolute value is determined in the ninth step to be smaller than the calculation error; and
an 11th step of substituting the drain-to-source current calculated in the eighth step into the drain-to-source current to be used for calculation in the fifth step by the central processing unit when the absolute value is determined in the ninth step to be not less than the calculation error,
wherein after executing the 11th step, the fifth to ninth steps are repeated.

2. A simulation apparatus comprising:
an input device configured to input at least one of model parameters of a lateral diffused MOSFET (LDMOSFET), a gate-to-source voltage, a source-to-drain voltage, and a bulk-to-source voltage to be applied to the LDMOSFET, and an initial value of a drain-to-source current of the LDMOSFET;
a calculating device configured to calculate a resistance value in a drift region of the LDMOSFET, a voltage drop caused by the resistance value in the drift region, a potential of a source end, a potential of a channel end, and the drain-to-source current of the LDMOSFET on the basis of the model parameters of the LDMOSFET, the gate-to-source voltage, the source-to-drain voltage, and the bulk-to-source voltage of the LDMOSFET, and the initial value of the drain-to-source current of the LDMOSFET, which are input by the input device;
a storage device configured to store the model parameters of the LDMOSFET, the gate-to-source voltage, the source-to-drain voltage, and the bulk-to-source voltage of the LDMOSFET, and the initial value of the drain-to-source current of the LDMOSFET, which are input by the input device, a program which describes an expression based on drift-diffusion approximation by a surface potential model, a program which describes an arithmetic expression for calculating the resistance value in the drift region of the LDMOSFET, a program which describes an arithmetic expression for calculating the voltage drop caused by the resistance in the drift region of the LDMOSFET, a program which describes an arithmetic expression for calculating the potential of the source end of the LDMOSFET, a program which describes an arithmetic expression for calculating the potential of the channel end of the LDMOSFET, a program which describes an arithmetic expression of the drain-to-source current of the LDMOSFET, and an arithmetic result calculated by the calculating device; and
an output device configured to output the result calculated by the calculating device,
wherein the calculating device calculates the resistance value in the drift region in accordance with the program which describes the expression based on drift-diffusion approximation by the surface potential model, and the program which describes the arithmetic expression for calculating the resistance value in the drift region of the LDMOSFET, which are stored in the storage device to calculate a drain-to-source current of an MOSFET, calculates the voltage drop caused by the resistance in the drift region of the LDMOSFET in accordance with the program which describes the arithmetic expression for calculating the voltage drop caused by the resistance in the drift region of the LDMOSFET, on the basis of the calculated resistance value in the drift region, calculates the potential of the source end of the LDMOSFET by solving a Poisson's equation by iterative calculation in accordance with the program which describes the arithmetic expression for calculating the potential of the source end of the LDMOSFET, calculates the potential of the channel end of the LDMOSFET by solving a Poisson's equation by iterative calculation in accordance with the program which describes the arithmetic expression for calculating the potential of the channel end of the LDMOSFET, calculates the drain-to-source current of the LDMOSFET in accordance with the program which describes the arithmetic expression of the drain-to-source current of the LDMOSFET, determines whether an absolute value of a difference between the calculated drain-to-source current and the initial value of the drain-to-source current input by the input device is not more than a predetermined calculation error, and upon determining that the absolute value is smaller than the calculation error, calculates charge densities and capacitances, and upon determining that the absolute value is not less than the calculation error, substitutes the calculated drain-to-source current into the set initial value of the drain-to-source current.

* * * * *